United States Patent
Takahashi et al.

(10) Patent No.: US 10,010,909 B2
(45) Date of Patent: Jul. 3, 2018

(54) PIEZOELECTRIC ELEMENT, ACOUSTIC GENERATOR, ACOUSTIC GENERATION DEVICE, AND ELECTRONIC APPARATUS

(71) Applicant: KYOCERA Corporation, Kyoto-shi, Kyoto (JP)

(72) Inventors: Tooru Takahashi, Kyoto (JP); Kentarou Miyazato, Kyoto (JP); Kenji Yamakawa, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 29 days.

(21) Appl. No.: 15/327,843

(22) PCT Filed: Jul. 21, 2015

(86) PCT No.: PCT/JP2015/070700
§ 371 (c)(1),
(2) Date: Jan. 20, 2017

(87) PCT Pub. No.: WO2016/017475
PCT Pub. Date: Feb. 4, 2016

(65) Prior Publication Data
US 2017/0203333 A1    Jul. 20, 2017

(30) Foreign Application Priority Data

Jul. 30, 2014  (JP) ................................ 2014-155082

(51) Int. Cl.
*H01L 41/04*  (2006.01)
*B06B 1/06*  (2006.01)

(52) U.S. Cl.
CPC .................. *B06B 1/0644* (2013.01)

(58) Field of Classification Search
CPC ..... B06B 1/0644; H01L 41/083; H04R 17/00; H04R 7/26
See application file for complete search history.

(56) References Cited

U.S. PATENT DOCUMENTS

| 2014/0321677 | A1 | 10/2014 | Fukuoka et al. | |
| 2016/0337758 | A1 * | 11/2016 | Kushima | H04R 7/26 |
| 2016/0337759 | A1 * | 11/2016 | Kushima | H04R 7/26 |

FOREIGN PATENT DOCUMENTS

| EP | 2937913 A1 * | 10/2015 | ......... H01L 41/0471 |
| JP | 2010172196 A * | 8/2010 | |

(Continued)

*Primary Examiner* — J. San Martin
(74) *Attorney, Agent, or Firm* — Volpe and Koenig, P.C.

(57) ABSTRACT

There are provided a piezoelectric element capable of implementing an acoustic generator having excellent characteristics and a simple structure, and an acoustic generator, an acoustic generation device, and an electronic apparatus using the same. A piezoelectric element includes a piezoelectric layer; a first conductor; a second conductor; a third conductor; a fourth conductor; a fifth conductor; and a sixth conductor, and includes a first portion, a second portion, and a third portion. The first portion is a portion where the first conductor and the second conductor face each other, and the second portion is a portion where the third conductor and the fourth conductor face each other. The third portion is a portion where the fifth conductor and the sixth conductor do not face each other, the third portion being located between the first portion and the second portion.

8 Claims, 9 Drawing Sheets

(56) References Cited

FOREIGN PATENT DOCUMENTS

| JP | 5313904 B2 * | 10/2013 | ............ | H01L 41/083 |
| WO | WO 2013065657 A1 * | 5/2013 | ............ | B06B 1/0611 |
| WO | 2013/099512 A1 | 7/2013 | | |
| WO | WO 2016158743 A1 * | 10/2016 | ............ | H01L 41/047 |

* cited by examiner

PIEZOELECTRIC ELEMENT, ACOUSTIC GENERATOR, ACOUSTIC GENERATION DEVICE, AND ELECTRONIC APPARATUS

TECHNICAL FIELD

The present invention relates to a piezoelectric element, and an acoustic generator, an acoustic generation device, and an electronic apparatus using the same.

BACKGROUND ART

In the related art, an acoustic generator having a structure in which two piezoelectric elements are attached on one principal surface of a vibration plate and a load member is attached at a position between the two piezoelectric elements is known (for example, refer to Patent Literature 1). The acoustic generator described in Patent Literature 1 has excellent characteristics in which a drastic change of a sound pressure in a specific frequency is alleviated and thus the change of the sound pressure due to the frequency is small.

CITATION LIST

Patent Literature

Patent Literature 1: WO2013/099512A1

SUMMARY OF INVENTION

Technical Problem

However, the acoustic generator in the related art has a problem in that time and efforts are required for the manufacture due to the great number of components and the complicated structure.

The invention is devised in consideration of such a problem in the technique in the related art, and an object thereof is to provide a piezoelectric element capable of implementing an acoustic generator having excellent characteristics and a simple structure, and an acoustic generator, an acoustic generation device, and an electronic apparatus using the same.

Solution to Problem

A piezoelectric element according to an embodiment of the invention includes: a piezoelectric layer; a first conductor; a second conductor; a third conductor; a fourth conductor; a fifth conductor which connects the first conductor and the third conductor; and a sixth conductor which connects the second conductor and the fourth conductor, the piezoelectric element including a first portion where the first conductor and the second conductor face each other across the piezoelectric layer interposed between the first conductor and the second conductor, a second portion where the third conductor and the fourth conductor face each other across the piezoelectric layer interposed between the third conductor and the fourth conductor, and a third portion where the fifth conductor and the sixth conductor do not face each other across the piezoelectric layer interposed between the fifth conductor and the sixth conductor, the third portion being located between the first portion and the second portion when viewed from a first direction which is a thickness direction of the piezoelectric layer.

An acoustic generator according to another embodiment of the invention includes: the piezoelectric element mentioned above; and a vibrating body to which the piezoelectric element is attached.

An acoustic generation device according to still another embodiment of the invention includes: the acoustic generator mentioned above; and an enclosure attached to the acoustic generator.

An electronic apparatus according to still another embodiment of the invention includes: the acoustic generator mentioned above; and an electronic circuit connected to the acoustic generator, the electronic apparatus having a function of generating sound from the acoustic generator.

Advantageous Effects of Invention

By using a piezoelectric element of the invention, it is possible to implement an acoustic generator, an acoustic generation device, and an electronic apparatus which have excellent characteristics and a simple structure.

DESCRIPTION OF EMBODIMENTS

Figure 1:
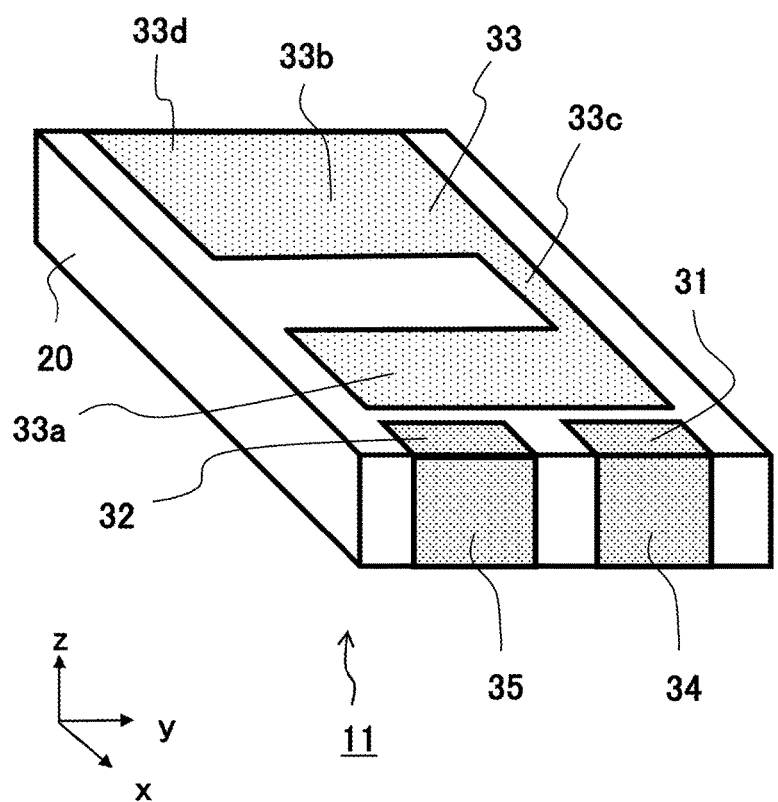
FIG. 1 is a perspective view schematically illustrating a piezoelectric element according to a first embodiment of the invention.

Hereinafter, a piezoelectric element, an acoustic generator, an acoustic generation device, and an electronic apparatus which are embodiments of the invention will be described in detail with reference to accompanying drawings. In addition, in the drawings, directions are illustrated by using an x-axis, a y-axis, a z-axis which are orthogonal to each other.

First Embodiment

Figure 2:
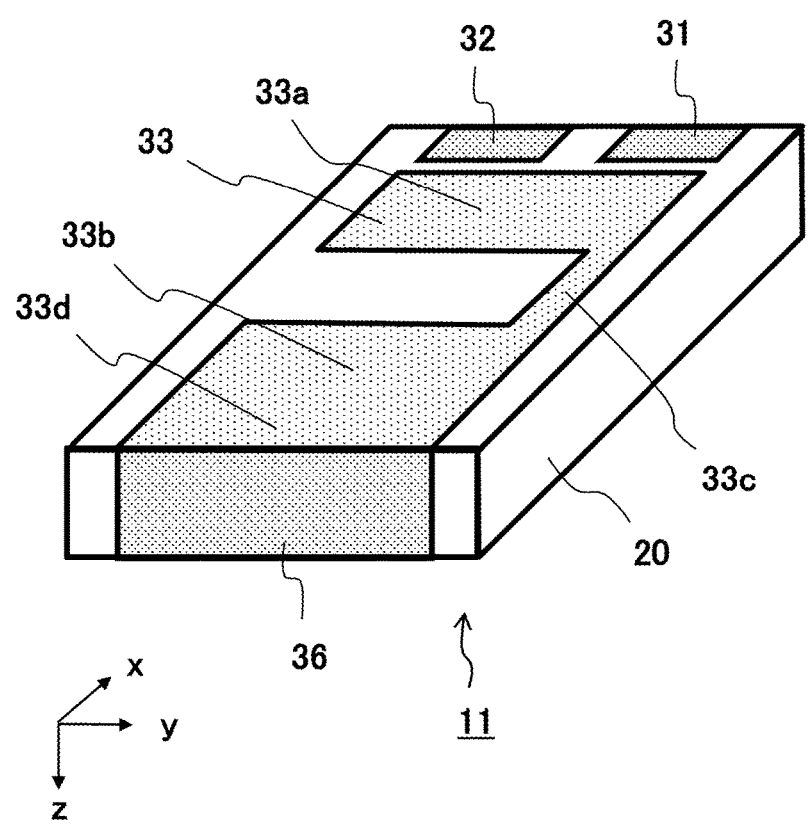
FIG. 2 is a perspective view schematically illustrating the piezoelectric element according to the first embodiment of the invention.
Figure 3:
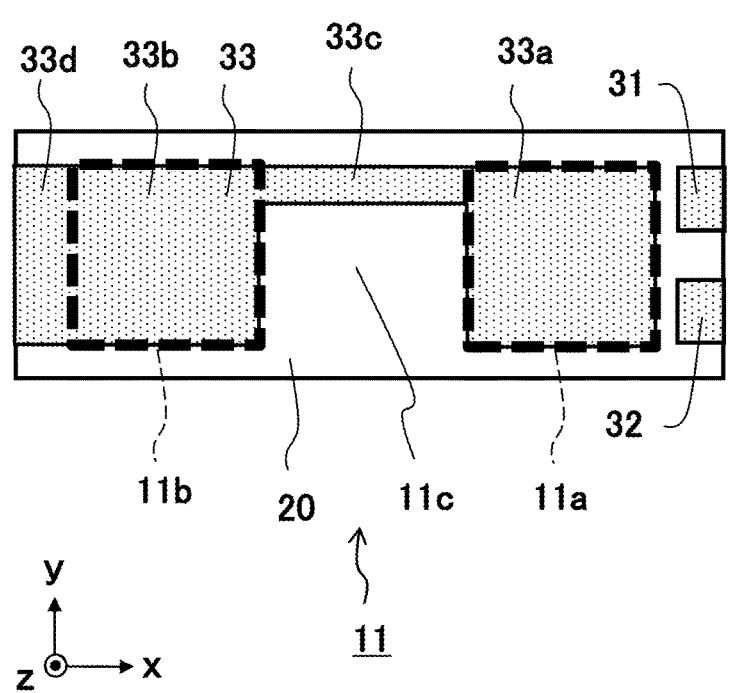
FIG. 3 is a plan view schematically illustrating the piezoelectric element according to the first embodiment of the invention.
Figure 4:
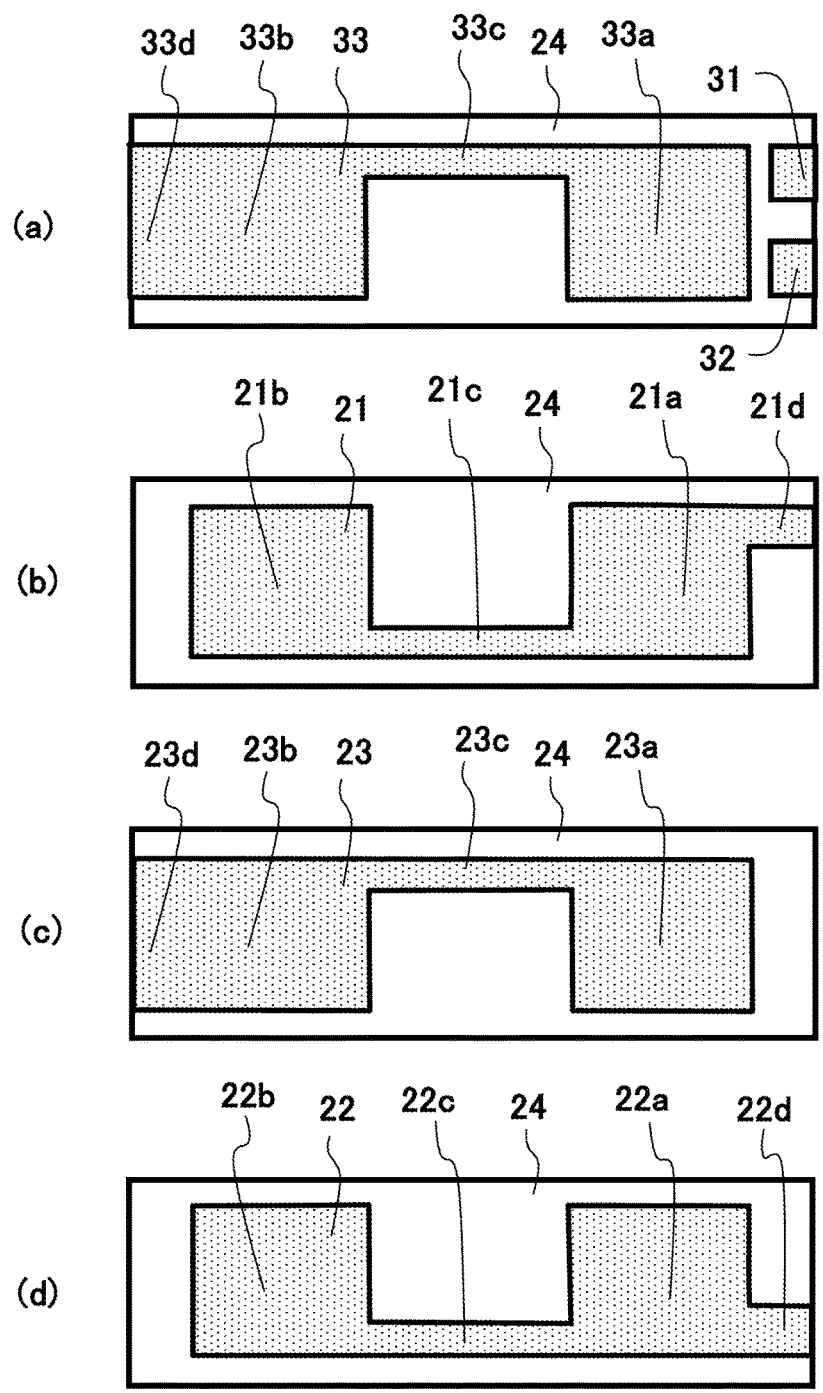
FIG. 4 is a diagram illustrating shapes of conductors included in the piezoelectric element according to the first embodiment of the invention.
Figure 5:
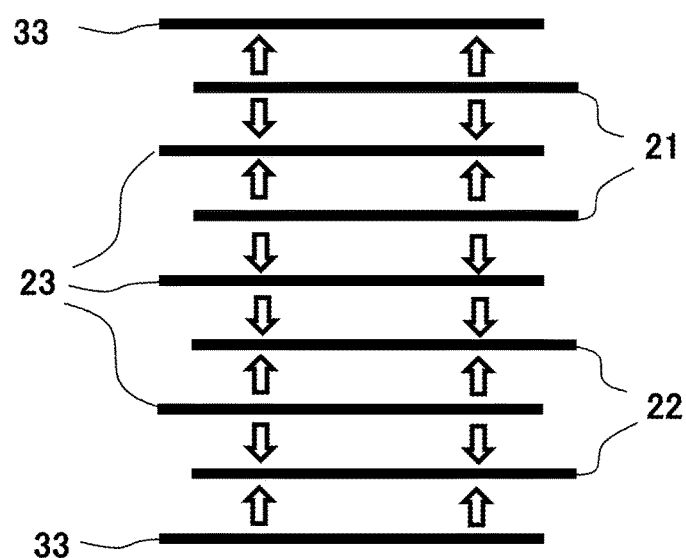
FIG. 5 is a diagram illustrating a disposition of conductors in the piezoelectric element according to the first embodiment of the invention and polarization directions of piezoelectric layers.
Figure 5:
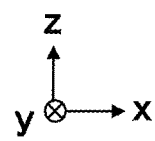

FIGS. 1 and 2 are perspective views schematically illustrating a piezoelectric element 11 according to a first embodiment of the invention, and respectively illustrate states viewed from different directions. FIG. 3 is a plan view schematically illustrating the piezoelectric element 11, and illustrates a state viewed from a +z direction side. FIG. 4 is a diagram illustrating shapes of conductors included in the piezoelectric element 11. FIG. 5 is a diagram illustrating a disposition of conductors in the piezoelectric element 11 and polarization directions of piezoelectric layers.

As illustrated in FIGS. 1 to 3, the piezoelectric element 11 of the embodiment has a rectangular parallelepiped shape, and has a plate shape whose dimension in a thickness direction (z-axis direction) is small. Both principal surfaces (both end surfaces in the z-axis direction) of the piezoelectric element have a rectangular shape which is long in the x-axis direction. In addition, the piezoelectric element 11 includes a stacked body 20, a conductor 31, a conductor 32, a conductor 33, a conductor 34, a conductor 35, and a conductor 36. The stacked body 20 includes piezoelectric layers 24, a conductor 21, a conductor 22, and a conductor 23.

FIGS. 4(a) to 4(d) are plan views schematically illustrating shapes of the conductor 21, the conductor 22, the conductor 23, the conductor 31, the conductor 32, and the conductor 33. FIG. 4(a) is a diagram illustrating the conductor 31, the conductor 32, and the conductor 33 which are disposed on both principal surfaces of the stacked body 20. FIG. 4(b) is a diagram illustrating the conductor 21 disposed inside the stacked body 20. FIG. 4(c) is a diagram illustrating the conductor 23 disposed inside the stacked body 20. FIG. 4(d) is a diagram illustrating the conductor 22 disposed inside the stacked body 20. The stacked body 20 is configured by alternately disposing a plurality of conductors (the conductor 21, the conductor 22, and the conductor 23) and a plurality of piezoelectric layers 24 in the z-axis direction. The piezoelectric element 11 is configured by disposing the conductor 31, the conductor 32, the conductor 33, the conductor 34, the conductor 35, and the conductor 36 on the surface of the stacked body 20. In addition, a plurality of conductors 21, a plurality of conductors 22, and a plurality of conductors 23 are disposed inside the stacked body 20.

Each of the conductors 31 is disposed on each of both the principal surfaces of the stacked body 20, and each conductor 31 is connected to the conductor 34 disposed on the surface on the +x direction side of the stacked body 20. Each of the conductors is disposed on each of both the principal surfaces of the stacked body 20, and each conductor 32 is connected to the conductor 35 disposed on the surface on the +x direction side of the stacked body 20.

Each of the conductors 33 is disposed on each of both the principal surfaces of the stacked body 20, and each conductor 33 is connected to the conductor 36 disposed on the surface on the −x direction side of the stacked body 20. In addition, the conductor 33 is configured by integrally connecting a first conductor 33a, a third conductor 33b, a fifth conductor 33c, and a conductor 33d. In addition, the fifth conductor 33c connects the first conductor 33a and the third conductor 33b, and the conductor 33d connects the third conductor 33b and the conductor 36.

The plurality of conductors 23 are disposed inside the stacked body 20, and each conductor 23 is connected to the conductor 36 disposed on the surface on the −x direction side of the stacked body 20. In addition, the conductor 23 is configured by integrally connecting a first conductor 23a, a third conductor 23b, a fifth conductor 23c, and a conductor 23d. In addition, the fifth conductor 23c connects the first conductor 23a and the third conductor 23b, and the conductor 23d connects the third conductor 23b and the conductor 36.

The plurality of conductors 21 are disposed inside the stacked body 20, and each conductor 21 is connected to the conductor 34 disposed on the surface on the +x direction side of the stacked body 20. In addition, the conductor 21 is configured by integrally connecting a second conductor 21a, a fourth conductor 21b, a sixth conductor 21c, and a conductor 21d. In addition, the sixth conductor 21c connects the second conductor 21a and the fourth conductor 21b, and the conductor 21d connects the second conductor 21a and the conductor 34.

The plurality of conductors 22 are disposed inside the stacked body 20, and each conductor 22 is connected to the conductor 35 disposed on the surface on the +x direction side of the stacked body 20. In addition, the conductor 22 is configured by integrally connecting a second conductor 22a, a fourth conductor 22b, a sixth conductor 22c, and a conductor 22d. In addition, the sixth conductor 22c connects the second conductor 22a and the fourth conductor 22b, and the conductor 22d connects the second conductor 22a and the conductor 35.

The two conductors 31 and the plurality of conductors 21 are connected to each other via the conductor 34, and are connected to the same potential. The two conductors 32 and the plurality of conductors 22 are connected to each other via the conductor 35, and are connected to the same potential. The two conductors 33 and the plurality of conductors 23 are connected to each other via the conductor 36, and are connected to the same potential.

FIG. 5 is a diagram illustrating a disposition of the conductors 21, the conductors 22, the conductors 23, and the conductors 33 in the thickness direction (z-axis direction) of the piezoelectric element 11 and the polarization directions of the piezoelectric layers 24. In FIG. 5, the piezoelectric layers 24 are not illustrated. As illustrated in FIG. 5, the conductor 23 or the conductor 33, and the conductor 21 or the conductor 22 are alternately disposed in the z-axis direction. In addition, on the +z direction side of the piezoelectric element 11, the conductor 23 or the conductor 33, and the conductor 21 are alternately disposed, and on the −z direction side of the piezoelectric element 11, the conductor 23 or the conductor 33, and the conductor 22 are alternately disposed.

The first conductor 23a or the first conductor 33a, and the second conductor 21a or the second conductor 22a are disposed so as to face each other across the piezoelectric layer 24 interposed therebetween, and the third conductor 23b or the third conductor 33b, and the fourth conductor 21b or the fourth conductor 22b are disposed so as to face each other across the piezoelectric layer 24 interposed therebetween.

In detail, on the +z direction side of the piezoelectric element 11, the first conductor 23a or the first conductor 33a, and the second conductor 21a are disposed so as to face each other across the piezoelectric layer 24 interposed therebetween, and the third conductor 23b or the third conductor 33b, and the fourth conductor 21b are disposed so as to face each other across the piezoelectric layer 24 interposed therebetween. In addition, on the −z direction side of the piezoelectric element 11, the first conductor 23a or the first conductor 33a, and the second conductor 22a are disposed so as to face each other across the piezoelectric layer 24 interposed therebetween, and the third conductor 23b or the third conductor 33b, and the fourth conductor 22b are disposed so as to face each other across the piezoelectric layer 24 interposed therebetween.

In this manner, the piezoelectric element 11 includes a first portion 11a where the first conductors (23a and 33a)

and the second conductors (21*a* and 22*a*) face each other across the piezoelectric layer 24 interposed between the first conductors and the second conductors; and a second portion 11*b* where the third conductors (23*b* and 33*b*) and the fourth conductors (21*b* and 22*b*) face each other across the piezoelectric layer 24 interposed between the third conductors and the fourth conductors.

As illustrated in FIG. 3, the first portion 11*a* and the second portion 11*b* are disposed so as to be spaced from each other in a length direction (x-axis direction) of the piezoelectric element 11. In addition, as illustrated in FIG. 3, the piezoelectric element 11 includes a third portion 11*c*. The third portion 11*c* is a portion where the fifth conductors (23*c* and 33*c*) and the sixth conductors (21*c* and 22*c*) do not face each other across the piezoelectric layer 24 interposed between the fifth conductors and the sixth conductors, the third portion 1*c* being located between the first portion 11*a* and the second portion 11*b* when viewed from the z-axis direction. It is preferable that the third portion 11*c* is located between the first portion 11*a* and the second portion 11*b* in the length direction (x-axis direction) of the piezoelectric element 11.

In addition, the piezoelectric layers 24 have polarization directions indicated by arrows in FIG. 5. For example, such polarization can be obtained by applying a DC voltage such that the potential of the conductor 21 is higher than those of the conductor 23 and the conductor 33, and the potential of the conductor 22 is lower than those of the conductor 23 and the conductor 33. When vibrating the piezoelectric element 11, a first feeder line (not illustrated) is connected to the conductor 31 and the conductor 32, a second feeder line (not illustrated) is connected to the conductor 33, and an AC voltage is applied such that a potential difference is generated between the conductor 21 and the conductor 22, and between the conductor 23 and the conductor 33.

In this manner, in the first portion 11*a* and the second portion 11*b* of the piezoelectric element 11, the relationship on the +z direction side between the direction of the electric field applied at a certain time and the direction of the polarization is opposite to that on the −z direction side. In this manner, for example, in the first portion 11*a* and the second portion 11*b*, when the +z direction side extends in the x-axis direction at a certain time, the −z direction side contracts in the x-axis direction. Accordingly, the first portion 11*a* and the second portion 11*b* of the piezoelectric element 11 conduct flexural vibration in the z-axis direction such that the amplitude changes in the x-axis direction when receiving an electric signal. In this manner, the first portion 11*a* and the second portion 11*b* are active portions where the deformation is generated in the piezoelectric layer 24 when the electric signal is inputted.

The third portion 11*c* which is located between the first portion 11*a* and the second portion 11*b* in a plan view from the z-axis direction, is a counter-conductor-non-forming portion which is a portion where there is no conductors facing each other across the piezoelectric layer 24 interposed therebetween. Therefore, the third portion 11*c* is an inactive portion where the deformation of the piezoelectric layer 24 is not generated even if the electric signal is inputted. Further, since it is sufficient that the third portion 11*c* is an inactive portion, it is sufficient that the third portion 11*c* is a portion where two conductors which face each other across the piezoelectric layer interposed between the two conductors, potentials to which the two conductors are connected being different, do not exist. For example, two conductors configured to face each other across the piezoelectric layer 24 interposed between the two conductors, potentials to which the two conductors are connected being the same, may exist in the third portion 11*c*.

The relationship on the +z direction between the direction of the electric field applied at a certain time and the direction of the polarization may not be opposite to that on −z direction side, and the first portion 11*a* and the second portion 11*b* may be configured to conduct stretching vibration when the electric signal is inputted. In such a case, for example, it is possible to cause the first portion 11*a* and the second portion 11*b* to conduct flexural vibration by attaching a metal plate or the like to the first portion 11*a* and the second portion 11*b*. In addition, a configuration may be adopted in which only one piezoelectric layer, one first conductor, one second conductor, one third conductor, and one fourth conductor are present.

The piezoelectric layer 24 can be formed by using piezoelectric ceramics used in the related art. For example, non-lead-based piezoelectric materials such as lead zirconate (PZ), lead zirconate titanate (PZT), a Bi-layered compound, and a tungsten bronze structure compound can be used. The thickness of a single layer of the piezoelectric layers 24 is, for example, about 10 to 100 μm.

The conductor 21, the conductor 22, and the conductor 23 can be formed by using known various metallic materials. For example, metallic components formed of silver and palladium, and material components constituting the piezoelectric layer can be used, but other materials may be used. The conductor 31, the conductor 32, the conductor 33, the conductor 34, the conductor 35, and the conductor 36 can be formed by using known various metallic materials. For example, metallic components formed of silver and materials containing glass components can be preferably used, but other materials may be used.

In this manner, the piezoelectric element 11 includes the piezoelectric layers 24, the first conductors (23*a* and 33*a*), the second conductors (21*a* and 22*a*), the third conductors (23*b* and 33*b*), and the fourth conductors (21*b* and 22*b*). In addition, the piezoelectric element 11 includes the first portion 11*a*, the second portion 11*b*, and the third portion 11*c*. The first portion 11*a* is a portion where the first conductors (23*a* and 33*a*) and the second conductors (21*a* and 22*a*) face each other across the piezoelectric layer 24 interposed between the first conductors and the second conductors, and is an active portion. The second portion 11*b* is a portion where the third conductors (23*b* and 33*b*) and the fourth conductors (21*b* and 22*b*) face each other across the piezoelectric layer 24 interposed between the third conductors and the fourth conductors, and is an active portion. The third portion 11*c* is a portion where two conductors connected to different potentials do not face each other across the piezoelectric layer 24 interposed between the two conductors, the third portion 11*c* being located between the first portion 11*a* and the second portion 11*b* when viewed from the z-axis direction which is a thickness direction of the piezoelectric layer 24, and is an inactive portion. Further, a potential to which the first conductors (23*a* and 33*a*), the third conductors (23*b* and 33*b*) and the fifth conductors (23*c* and 33*c*) are connected, and a potential to which the second conductors (21*a* and 22*a*), the fourth conductors (21*b* and 22*b*) and the sixth conductors (21*c* and 22*c*) are connected are different. In the piezoelectric element 11 having such a configuration, the first portion 11*a* and the second portion 11*b* respectively vibrate according to the electric signal, and thus can function in the same manner as general two piezoelectric elements which are provided in parallel. In addition, in the piezoelectric element 11, the third portion 11*c* does not vibrate. Thus, the third portion functions as a load member which suppresses vibration. In this manner, it is possible to implement the same function as two piezoelectric elements and one load member disposed between the two piezoelectric elements in the acoustic generator described in, for example, Patent Literature 1 by one piezoelectric element 11. In addition, the third portion 11c of the piezoelectric element 11 is not deformed even when the electric signal is inputted. Therefore, for example, even in a case where the piezoelectric element 11 is bonded to the vibration plate and the piezoelectric element 11 is vibrated, internal stress is not generated in the bonding part of the third portion 11c and the vibration plate. Thus, in the bonding part of the third portion 11c and the vibration plate, it is possible to prevent the generation of microcracks or deterioration of the bonding strength caused when the internal stress is repeatedly applied for a long period of time. It is possible to obtain the piezoelectric element 11 in which the first portion 11a and the second portion 11b can strongly vibrate and which can be firmly bonded to another object for a long period of time by the third portion 11c.

In addition, the piezoelectric element 11 includes: the fifth conductor 23c which connects the first conductor 23a and the third conductor 23b; the fifth conductor 33c which connects the first conductor 33a and the third conductor 33b; the sixth conductor 21c which connects the second conductor 21a and the fourth conductor 21b; and the sixth conductor 22c which connects the second conductor 22a and the fourth conductor 22b. In this manner, it is possible to vibrate the piezoelectric element 11 using two feeder lines, and thus to simplify the feeder line.

In addition, in the piezoelectric element 11, the fifth conductor 23c is integrally connected to the first conductor 23a and the third conductor 23b, the fifth conductor 33c is integrally connected to the first conductor 33a and the third conductor 33b, the sixth conductor 21c is integrally connected to the second conductor 21a and the fourth conductor 21b, and the sixth conductor 22c is integrally connected to the second conductor 22a and the fourth conductor 22b. Further, the fifth conductors (23c and 33c) and the sixth conductors (21c and 22c) are disposed on the surface of or inside the piezoelectric element 11. That is, the fifth conductor 23c, the sixth conductor 21c, and the sixth conductor 22c are disposed inside the piezoelectric element 11, and the fifth conductor 33c is disposed on the surface of the piezoelectric element 11. With this configuration, the fifth conductor 23c, the first conductor 23a, and the third conductor 23b can be formed simultaneously by using the same material, the fifth conductor 33c, the first conductor 33a, and the third conductor 33b can be formed simultaneously by using the same material, the sixth conductor 21c, the second conductor 21a, and the fourth conductor 21b can be formed simultaneously by using the same material, and the sixth conductor 22c, the second conductor 22a, and the fourth conductor 22b can be formed simultaneously by using the same material. Thus, it is possible to implement the piezoelectric element 11 which has a simple structure and can be easily manufactured. However, this configuration is not essential. For example, the fifth conductors (23c and 33c) and the sixth conductors (21c and 22c) may be formed of metal lines and be connected to other conductors through conductive bonding members such as solder.

In addition, when the piezoelectric element 11 is viewed from the z-axis direction, the shape of the first portion 11a and the shape of the second portion 11b are identical with each other, and the area of the first portion 11a and the area of the second portion 11b are equal to each other; however, the invention is not limited thereto. For example, when viewed from the z-axis direction, the shape of the first portion 11a and the shape of the second portion 11b may be different from each other. In addition, when viewed from the z-axis direction, the area of the first portion 11a and the area of the second portion 11b may be different from each other. With this configuration, the symmetric properties of the shape of the piezoelectric element 11 are lowered, and thus the degeneracy of the resonance mode in the vibration of the piezoelectric element 11 unravels to increase the resonance mode. Therefore, resonance peaks in the frequency characteristics of the piezoelectric element 11 are dispersed, and thus the level of each peak can be decreased. In addition, in a case where an acoustic generator is configured by using the piezoelectric element 11, it is possible to obtain favorable characteristics in which the level of the peak in the frequency characteristic of the sound pressure is small, and the change of the sound pressure due to the frequency is small.

For example, the piezoelectric element 11 can be manufactured in a manner described below. First, a binder, a dispersant, a plasticizing agent, and a solvent are added to powder of a piezoelectric material, and the resultant is mixed to manufacture slurry. As the piezoelectric material, it is possible to use either lead-based or non-lead-based material. Next, the obtained slurry is molded into a sheet shape to manufacture a green sheet. Next, conductive paste is printed on the green sheet to form a conductive pattern which forms the conductor 21, the conductor 22, and the conductor 23. Next, green sheets on which a conductive pattern is formed are laminated to manufacture a laminated molded body. Next, the laminated molded body is subjected to degreasing and firing, and then is cut into a predetermined dimension, thereby obtaining the stacked body 20. Next, if necessary, the outer circumferential part of the stacked body 20 is processed. Next, conductive paste is printed on an end surface in the z-axis direction of the stacked body 20 to form a conductive pattern which forms the conductor 31, the conductor 32, and the conductor 33, and conductive paste is printed on an end surface in the x-axis direction of the stacked body 20 to form a conductive pattern which forms the conductor 34, the conductor 35, and the conductor 36. Next, the conductor is subjected to baking at a predetermined temperature. In this manner, a structure to be the piezoelectric element 11 can be obtained. Finally, in order to impart piezoelectricity to the piezoelectric element 11, a DC voltage is applied through the conductor 31, the conductor 32, and the conductor 33, or the conductor 34, the conductor 35, and the conductor 36 to perform polarization of the piezoelectric layer 24. Thereby, it is possible to obtain the piezoelectric element 11.

Second Embodiment

Figure 6:
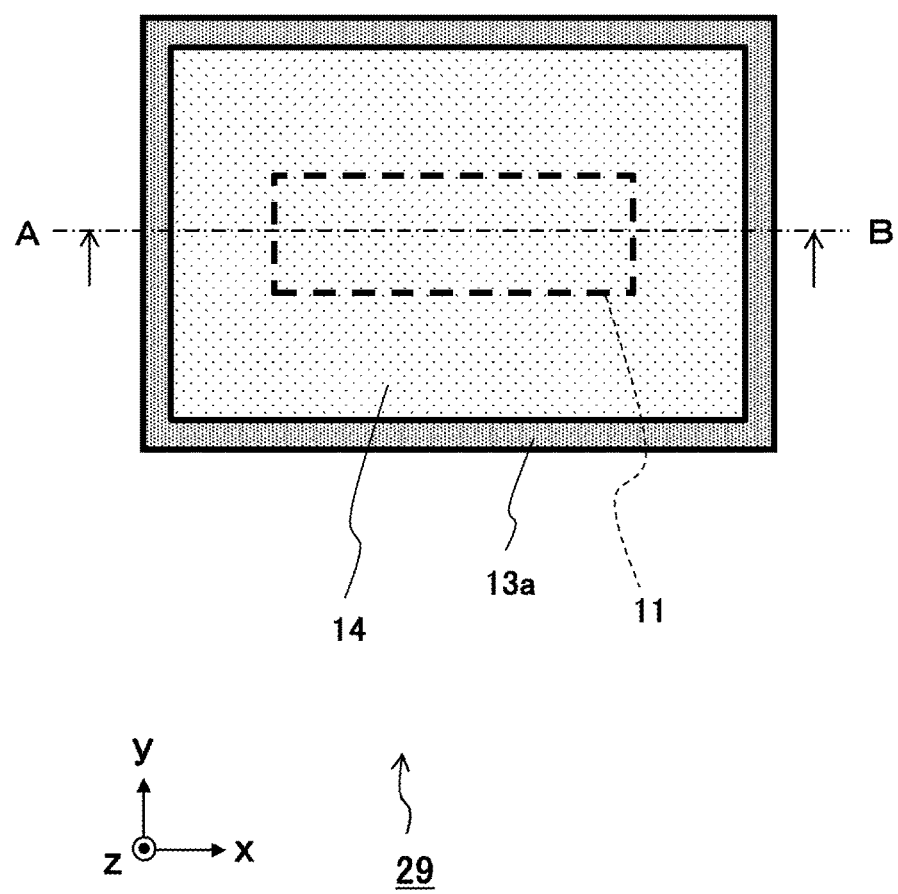
FIG. 6 is a plan view schematically illustrating an acoustic generator according to a second embodiment of the invention.
Figure 7:
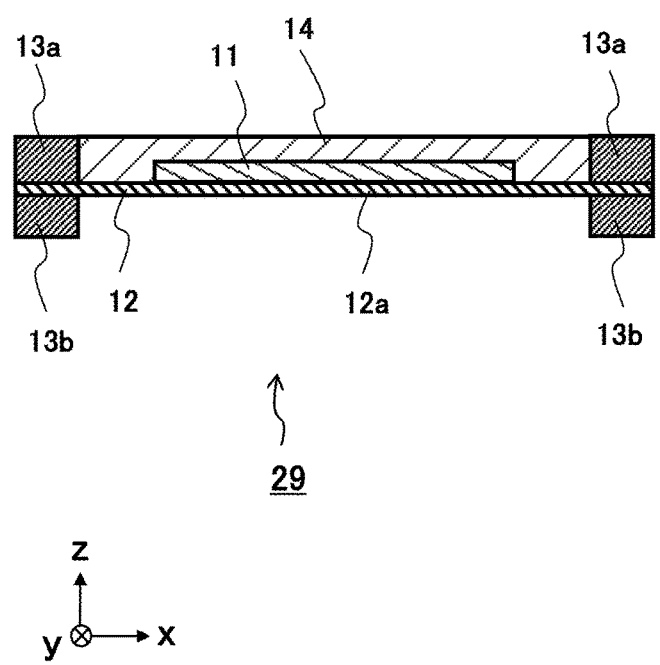
FIG. 7 is a cross-sectional view taken along the line A-B of FIG. 6.

FIG. 6 is a plan view schematically illustrating an acoustic generator 29 according to a second embodiment of the invention when viewed from +z direction. FIG. 7 is a cross-sectional view taken along the line A-B in FIG. 6. In the embodiment, the point of difference from the above first embodiment is described, the same reference numerals are assigned to the same constituent elements, and the duplicate description is not repeated. As illustrated in FIGS. 6 and 7, the acoustic generator 29 of the embodiment includes the piezoelectric element 11, a film 12, a frame 13a, a frame 13b, and a resin layer 14. The acoustic generator 29 generates sound when the electric signal is inputted. The sound generated by the acoustic generator 29 is not limited to the sound with an audible frequency of human beings, and may be sound whose frequency is lower than audible sound, or sound whose frequency is higher than audible sound.

The frames (13a and 13b) respectively have a rectangular frame shape. It is sufficient that it is difficult for the frames (13a and 13b) to be deformed compared to the film 12 and the resin layer 14, and the material and the thickness of the frame are not particularly limited. For example, it is possible to form the frames (13a and 13b) by using various metals, hard resins, plastics, engineering plastics, and ceramics. For example, it is possible to preferably use stainless steel having a thickness of 100 µm to 1000 µm.

The film 12 has a film shape (membrane shape), and can be formed by using, for example, a resin such as polyethylene terephthalate (PET), and polyimide. In addition, the thickness of the film 12 is, for example, 10 to 200 µm. Further, the film 12 is fixed such that the peripheral part is sandwiched between the frames (13a and 13b) in a state where tension is applied thereto in a planar direction (x-axis direction and y-axis direction). In this manner, the film 12 is supported by the frames (13a and 13b) so as to be capable of vibrating. In addition, in the film 12, a vibrating body 12a which can freely vibrate is configured by a portion which is located at the inner side of the frames (13a and 13b) and is not interposed between the frames (13a and 13b). That is, the vibrating body 12a has a rectangular film shape (membrane shape).

The shape of the frames (13a and 13b) is not limited to a rectangular shape, and may be a round shape or a rhombus. In addition, in a case where the frame 13b is not provided, for example, the film 12 may be bonded to the surface in the −z direction of the frame 13a. In addition, since it is sufficient that the vibrating body 12a has a film shape or a thin plate shape, it is possible to form the vibrating body 12a by a metal plate, a resin plate, paper, or the like in place of the film 12. In a case where the vibrating body 12a is a metal plate or a resin plate, the frame may not be provided.

Although not illustrated in detail, the piezoelectric element 11 is the piezoelectric element 11 of the first embodiment described above. The piezoelectric element 11 is attached to the surface on the +z direction side of the vibrating body 12a, and is integrated with the vibrating body 12a. The piezoelectric element 11 conducts flexural vibration in the z-axis direction when the electric signal is inputted, and the piezoelectric element 11 itself vibrates so that the vibrating body 12a vibrates. Then, sound is generated by the vibration of the vibrating body 12a. In addition, the piezoelectric element 11 and the film 12 are bonded to each other by a bonding member (not illustrated). As the bonding member, known various bonding members such as an adhesive of an epoxy resin, a silicone resin, a polyester resin or the like, or a double sided tape can be used.

The resin layer 14 is formed over the entirety of the inner side of the frame 13a so as to embed the piezoelectric element 11, and is integrated with the vibrating body 12a and the piezoelectric element 11. The resin layer 14 can be formed by using known various materials. For example, resins such as an acrylic resin or a silicone resin, or rubbers can be used. In addition, it is preferable that the thickness of the resin layer 14 is a thickness to the extent that the piezoelectric element 11 is entirely covered, but the resin layer 14 may be formed to cover at least a part of the film 12. The resin layer 14 exhibits an effect of enhancing the quality of sound generated from the acoustic generator 29, but it is not essential, and thus the resin layer 14 may be not provided in some cases.

As described above, the acoustic generator 29 includes the piezoelectric element 11 and the vibrating body 12a.

Further, the piezoelectric element 11 is attached to the vibrating body 12a, and thus the vibrating body 12a vibrates by the vibration of the piezoelectric element 11. In the acoustic generator 29 with the configuration described above, since it is possible to implement the same function as two piezoelectric elements and one load member disposed between the two piezoelectric elements in the acoustic generator described in Patent Literature 1 by one piezoelectric element 11, it is possible to implement an acoustic generator having excellent characteristics and a simple structure.

In addition, in the acoustic generator 29, the third portion 11c is located at a central portion of the vibrating body 12a when viewed from the z-axis direction. The central portion of the vibrating body 12a is location where the greatest amplitude is present in a plurality of resonance modes including the resonance mode having the lowest frequency in the vibration of the vibrating body 12a. Thus, the acoustic generator 29 can decrease the level of a plurality of peaks including a peak having the lowest frequency in the frequency characteristic of the sound pressure. The expression "the third portion 11c is located at the central portion of the vibrating body 12a" means a state where the center of gravity of the vibrating body 12a is located in the third portion 11c in a plan view from the thickness direction (the z-axis direction) of the piezoelectric element 11.

For example, the acoustic generator 29 can be manufactured in a manner described below. First, the periphery of the film 12 in a state where tension is applied thereto is fixed by being interposed between the frames (13a and 13b) to which an adhesive is applied, and is bonded by curing the adhesive. Then, the piezoelectric element 11 is bonded to the surface on the +z direction side of the vibrating body 12a by the adhesive, and a feeder line (not illustrated) is connected to the piezoelectric element 11. A resin is poured into the inner side of the frame 13a and is cured so as to form the resin layer 14. In this manner, the acoustic generator 29 can be obtained.

Third Embodiment

Figure 8:
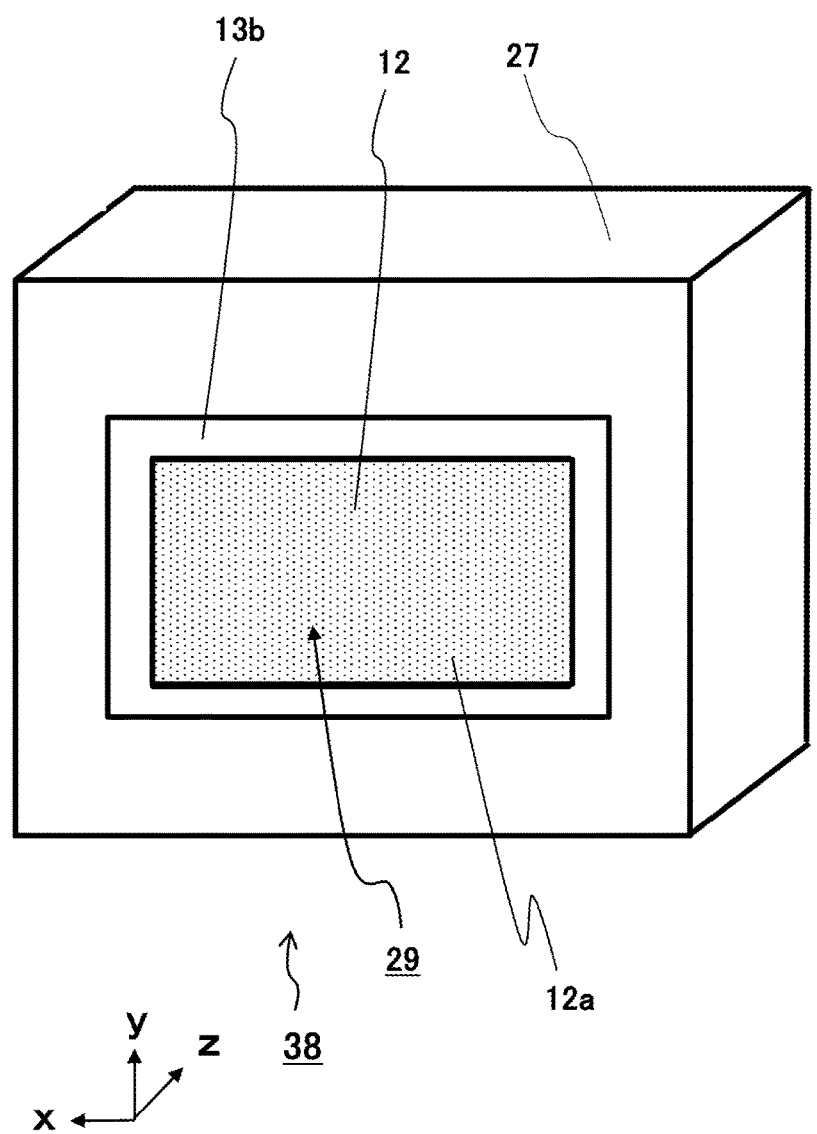
FIG. 8 is a perspective view schematically illustrating an acoustic generation device according to a third embodiment of the invention.

FIG. 8 is a perspective view schematically illustrating an acoustic generation device 38 according to a third embodiment of the invention. In the embodiment, the point of difference from the above second embodiment is described, the same reference numerals are assigned to the same constituent elements, and the duplicate description is not repeated. As illustrated in FIG. 8, the acoustic generation device 38 includes the acoustic generator 29 and an enclosure 27. The acoustic generator 29 is the acoustic generator 29 of the second embodiment.

The enclosure 27 has a rectangular parallelepiped box shape. In addition, the enclosure 27 has at least one opening, and the acoustic generator 29 is attached so as to block the opening. Further, the enclosure 27 is configured to surround the surface on the +z direction side of the acoustic generator 29. It is sufficient that the enclosure 27 has a function of restraining the sound generated on the +z direction side of the acoustic generator 29 from going around to the −z direction side of the acoustic generator 29. Therefore, the shape of the enclosure 27 is not limited to the rectangular parallelepiped shape, and may be various shapes such as a conical shape or a spherical shape. In addition, the enclosure 27 is not required to have a box shape, and may be a planar baffle. The enclosure 27 can be formed by using known various materials. For example, the enclosure 27 can be formed by using materials such as wood, synthetic resins, and metals.

The acoustic generation device 38 can generate sound with the favorable quality by causing the acoustic generator 29 of the second embodiment to generate sound. Since the acoustic generation device 38 includes the enclosure 27, it is possible to generate sound with the further favorable quality compared to a case of using the acoustic generator 29 only. An acoustic generator of other embodiments having the same performance may be used in place of the acoustic generator 29.

Fourth Embodiment

Figure 9:
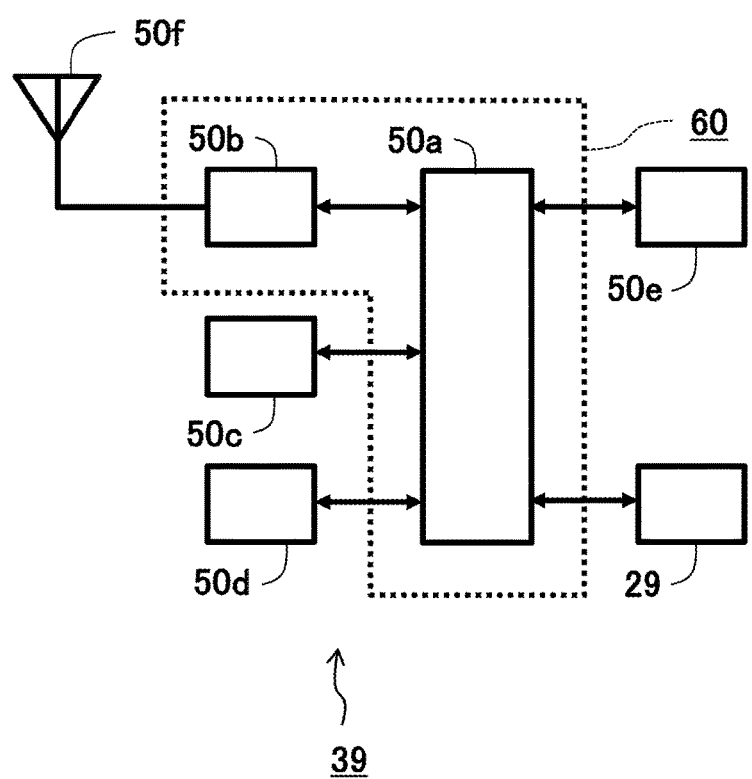
FIG. 9 is a block diagram illustrating a configuration of an electronic apparatus according to a fourth embodiment of the invention.

FIG. 9 is a block diagram illustrating a configuration of an electronic apparatus 39 according to a fourth embodiment of the invention. In the embodiment, the point of difference from the above second embodiment is described, the same reference numerals are assigned to the same constituent elements, and the duplicate description is not repeated. As illustrated in FIG. 9, the electronic apparatus 39 of the embodiment includes the acoustic generator 29, an electronic circuit 60, a key input section 50c, a microphone input section 50d, a display section 50e, and an antenna 50f. FIG. 9 is a block diagram in which an electronic apparatus such as a cellular phone, a tablet terminal, or a personal computer is assumed.

The electronic circuit 60 includes a control circuit 50a and a communication circuit 50b. In addition, the electronic circuit 60 is connected to the acoustic generator 29, and has a function of outputting a voice signal to the acoustic generator 29. The control circuit 50a is a control section of the electronic apparatus 39. The communication circuit 50b transmits or receives data via the antenna 50f on the basis of the control of the control circuit 50a.

The key input section 50c is an input device of the electronic apparatus 39, and receives a key input operation by an operator. The microphone input section 50d is an input device of the electronic apparatus 39, and receives a voice input operation by an operator. The display section 50e is an output device of the electronic apparatus 39, and outputs image information on the basis of the control of the control circuit 50a.

Although not illustrated in detail, the acoustic generator 29 is the acoustic generator 29 of the second embodiment. The acoustic generator 29 has a function as a sound output device of the electronic apparatus 39, and generates sound on the basis of the electric signal inputted from the electronic circuit 60. Further, the acoustic generator 29 is connected to the control circuit 50a of the electronic circuit 60, and generates sound by the electric signal controlled by the control circuit 50a.

In this manner, the electronic apparatus 39 includes at least the acoustic generator 29, and the electronic circuit 60 connected to the acoustic generator 29, and has a function of causing the acoustic generator 29 to generate sound. The electronic apparatus 39 can generate sound with the favorable quality by causing the acoustic generator 29 of the second embodiment to generate sound.

Further, the electronic apparatus 39 may have a configuration in which the electronic circuit 60, the key input section 50c, the microphone input section 50d, the display section 50e, the antenna 50f, and the acoustic generator 29 are attached to one housing. In addition, the electronic apparatus 39 includes: a main body in which the electronic circuit 60, the key input section 50c, the microphone input section 50d, the display section 50e, and the antenna 50f are attached to one housing; and the acoustic generator 29, and may have a configuration in which the main body and the acoustic generator are connected to be capable of transmitting the electric signal via a lead wire or the like.

In addition, the electronic apparatus 39 is not required to have all the key input section 50c, the microphone input section 50d, the display section 50e, and the antenna 50f, and preferably has at least the acoustic generator 29 and the electronic circuit 60. In addition, the electronic apparatus 39 may have other constituent elements. In addition, the electronic circuit 60 is not limited to the configuration described above, and may have other configurations.

The electronic apparatus 39 is not limited to the electronic apparatus such as a cellular phone, a tablet terminal, or a personal computer described above. The electronic apparatus 39 may be various electronic apparatuses having a function of generating sound or voice, such as a television, an audio device, a radio, a cleaner, a washing machine, a refrigerator, and a microwave oven. In addition, the electronic apparatus 39 may use an acoustic generator of other embodiments having the same performance in place of the acoustic generator 29 of the second embodiment.

Modified Example

The invention is not limited to the embodiments described above, and various modifications and improvements are possible without departing from the scope of the invention.

In the first embodiment described above, there is described an example in which the piezoelectric element includes a plurality of piezoelectric layers, first conductors, second conductors, third conductors, fourth conductors, fifth conductors, and sixth conductors, but the invention is not limited thereto. For example, the piezoelectric element may have one piezoelectric layer, one first conductor, one second conductor, one third conductor, one fourth conductor, one fifth conductor, and one sixth conductor.

In the second embodiment described above, there is described an example in which one piezoelectric element 11 is attached to the surface of the film 12, but the invention is not limited thereto. For example, a larger number of piezoelectric elements 11 may be attached to the surface of the film 12.

The acoustic generator is not limited to the structure of the second embodiment described above, and it is sufficient that the acoustic generator includes a piezoelectric element, and a vibrating body to which the piezoelectric element is attached. The shape of the vibrating body is not limited to the film shape, and may be, for example, a plate shape or a box shape. For example, a touch panel, a cover panel of a display, or a housing of an electronic apparatus may be used as the vibrating body constituting the acoustic generator.

In the fourth embodiment described above, there is described an example in which the acoustic generator 29 of the second embodiment is used, but the invention is not limited thereto. For example, an electronic apparatus may be adopted in which a display and a cover panel of the display are provided, a piezoelectric element is attached to the cover panel of the display, and the cover panel of the display is caused to vibrate to generate sound. In addition, an electronic apparatus may be adopted in which a touch panel is provided, a piezoelectric element is attached to the touch panel, and the touch panel is caused to vibrate to transmit vibration to a human body and to generate sound.

REFERENCE SIGNS LIST

11: Piezoelectric element
12a: Vibrating body 23a, 33a: First conductor
21a, 22a: Second conductor
23b, 33b: Third conductor
21b, 22b: Fourth conductor
23c, 33c: Fifth conductor
21c, 22c: Sixth conductor
27: Enclosure
29: Acoustic generator
38: Acoustic generation device
39: Electronic apparatus
60: Electronic circuit

The invention claimed is:

1. A piezoelectric element, comprising:
a piezoelectric layer;
a first conductor;
a second conductor;
a third conductor;
a fourth conductor;
a fifth conductor which connects the first conductor and the third conductor; and
a sixth conductor which connects the second conductor and the fourth conductor,
the piezoelectric element including a first portion where the first conductor and the second conductor face each other across the piezoelectric layer interposed between the first conductor and the second conductor,
a second portion where the third conductor and the fourth conductor face each other across the piezoelectric layer interposed between the third conductor and the fourth conductor, and
a third portion where the fifth conductor and the sixth conductor do not face each other across the piezoelectric layer interposed between the fifth conductor and the sixth conductor, the third portion being located between the first portion and the second portion when viewed from a first direction which is a thickness direction of the piezoelectric layer.

2. The piezoelectric element according to claim 1, wherein a potential to which the first conductor, the third conductor and the fifth conductor are connected, and a potential to which the second conductor, the fourth conductor and the sixth conductor are connected are different.

3. The piezoelectric element according to claim 1, wherein the fifth conductor is integrally connected to the first conductor and the third conductor, and is disposed on a surface of the piezoelectric element or inside the piezoelectric element, and the sixth conductor is integrally connected to the second conductor and the fourth conductor, and is disposed on a surface of the piezoelectric element or inside the piezoelectric element.

4. The piezoelectric element according to claim 1, wherein an area of the first portion and an area of the second portion are different when viewed from the first direction.

5. An acoustic generator, comprising:
the piezoelectric element according to claim 1; and
a vibrating body to which the piezoelectric element is attached.

6. The acoustic generator according to claim 5, wherein the third portion is located at a central portion of the vibrating body when viewed from the first direction.

7. An acoustic generation device, comprising:
the acoustic generator according to claim 5; and
an enclosure attached to the acoustic generator.

8. An electronic apparatus, comprising:
the acoustic generator according to claim 5; and
an electronic circuit connected to the acoustic generator.

* * * * *